(12) United States Patent
Shimizu

(10) Patent No.: US 7,786,795 B2
(45) Date of Patent: Aug. 31, 2010

(54) CLASS-D AMPLIFIER CIRCUIT

(75) Inventor: Nobuyuki Shimizu, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 49 days.

(21) Appl. No.: 12/199,818

(22) Filed: Aug. 28, 2008

(65) Prior Publication Data

US 2009/0066412 A1 Mar. 12, 2009

(30) Foreign Application Priority Data

Aug. 31, 2007 (JP) .............................. 2007-225513

(51) Int. Cl.
*H03F 3/38* (2006.01)

(52) U.S. Cl. ....................................................... 330/10
(58) Field of Classification Search .................. 330/10, 330/207 A, 251; 381/94.5, 104, 109
See application file for complete search history.

(56) References Cited

U.S. PATENT DOCUMENTS 5,805,020 A * 9/1998 Danz et al. ..................... 330/10

FOREIGN PATENT DOCUMENTS

JP 2004-048333 2/2004

* cited by examiner

*Primary Examiner*—Robert Pascal
*Assistant Examiner*—Khiem D Nguyen
(74) *Attorney, Agent, or Firm*—Volentine & Whitt, PLLC

(57) ABSTRACT

A class-D amplifier circuit of one aspect includes a gain controller, a pulse-width modulator, an output driver, and a drive controller. The gain controller selectively amplifies an analog input signal according to a level control signal, and outputs a corresponding gain-adjusted analog input signal. The pulse-width modulator converts the gain-adjusted analog input signal into a pulse signal. The output driver includes a plurality of output driver circuits which generate an amplified pulse signal corresponding to the pulse signal output by the pulse-width modulator. The drive controller selectively disables a subset of the plurality of output driver circuits according to the level control signal.

18 Claims, 3 Drawing Sheets

CLASS-D AMPLIFIER CIRCUIT

BACKGROUND

1. Field of the Invention The present invention relates to Class-D amplifier circuit which may be used, for example, as a power amplifier circuit of audio amplifier.

2. Description of the Related Art

FIG. 1 is a block diagram illustrating a conventional class-D amplifier circuit. As shown, the conventional class-D amplifier circuit includes pulse-width modulator 1, drive signal generator 2, output driver 3, and low-pass filter (LPF) 4.

The pulse-width modulator 1 converts an analog audio input (AIN) signal into binary pulse train (i.e., a pulse-width modulated PWM signal) having a duty ratio which is proportional to an amplitude of the AIN signal. The PWM signal (e.g., 1-MHz digital signal) can be obtained, for example, by utilizing a comparator to compare the AIN signal to a high-frequency saw-tooth wave signal.

The drive signal generator 2 converts the PWM signal into two drive signals, namely, a PGC drive signal and an NGC drive signal. As shown in FIG. 1, the PGC drive signal is applied to the gate of a PMOS transistor 3p of the output driver 3, and the NGC drive signal is applied to the gate of an NMOS transistor 3n of the output driver 3.

In operation, for example, the drive signal generator 2 outputs a PGC signal which turns ON the PMOS 3p when the logic level of pulse-width modulated PWM signal is "H" (high), and outputs an NGC signal which turns ON the NMOS 3n when the logic level of pulse-width modulated PWM signal is "L" (low). The drive signal generator 2 may be configured to avoid simultaneous driving both of the PMOS 3p and the NMOS 3n when the pulse-width modulated PWM signal is transitioning between logic levels.

As mentioned above, the output driver 3 includes the PMOS 3p and the NMOS 3n. The PMOS 3p and the NMOS 3n are connected in series between a positive voltage VSS and a negative voltage VDD, with an output of the output driver 3 being located at a connection node N.

In this conventional example, when the pulse-width modulated PWM signal is "H", the PMOS 3p is ON and NMOS 3n is OFF, and the potential at node N is roughly equal to the positive voltage VDD. Conversely, when the pulse-width modulated PWM signal is "L", the PMOS 3p is OFF and NMOS 3n is ON, and the potential at node N is roughly equal to the negative voltage VSS.

High-frequency components of the output of the output driver 3 are removed by the LPF 4 to obtain an amplified voice band analog output signal OUT. The output signal OUT is supplied to a load, such as speakers (not shown).

The PMOS 3p and the NMOS 3n of the output driver 3 function as switching elements, and the most significant signal power loss factor of the output driver 3 is PD loss (power dissipation loss) attributable to the on-resistance RON of the switch devices PMOS 3p and NMOS 3n. PD loss can be represented by the following equation:

$$PD = IO^2 \times RON = (PO/RL) \times RON$$

where IO is the magnitude of an output current, RL is the load resistance, RON is the on-resistance of the switch devices, and an PO is the output power.

Namely, PD loss is proportional to the output power PO and the on-resistance RON of the switch element. Therefore, any decrease in the on-resistance RON of the switch elements PMOS 3p and NMOS 3n will result in a decrease in the PD loss (assuming the output power PO remains the same).

However, as discussed below, there are significant constraints to be dealt with in attempting to decrease the on-resistance of the switch elements PMOS 3p and NMOS 3n.

The on-resistance (output impedance) of a PMOS device or an NMOS device can be approximated in accordance with the following equation:

$$RON = 1/(K \times (W/L) \times (VGON - VT))$$

where K is a coefficient by determined a manufacturing process, L and W are a gate width and a gate length of the NMOS or PMOS device, respectively, VGON is a gate voltage during an ON-state of the PMOS or NMOS device, and VT is a threshold voltage of the NMOS or PMOS device.

The variables VT, L and K are all constrained by manufacturing processes and/or limitations, and the variable VGON is constrained by the practical need to utilize a normal power supply voltage. Further, while it may be practical to increase the gate width W, the result would be an adverse increase in gate drive power.

That is, as the gate width W of the NMOS or PMOS device increases, the gate capacitance CG also increases. The power needed to drive the gate of the NMOS or PMOS device may be represented by the following equation:

$$PG = CG \times VGON^2 \times FSW$$

where CG is gate capacitance, VGON is a gate voltage during an ON-state of the PMOS or NMOS device, and FSW is a switching frequency.

Thus, an increase in gate capacitance will result in a proportional increase in power needed to drive the gates of the NMOS and PMOS devices, which in turn can reduce the power efficiency of the class-D amplifier.

SUMMARY

According to an aspect of the present invention, a class-D amplifier circuit is provided which includes a pulse-width modulator, an output driver, and a drive controller. The pulse-width modulator converts an input signal into a pulse signal. The output driver includes a plurality of output driver circuits which generate an amplified pulse signal corresponding to the pulse signal output by the pulse-width modulator. The drive controller selectively disables a subset of the plurality of output driver circuits.

According to another aspect of the present invention, a class-D amplifier circuit is provided which includes a gain controller, a pulse-width modulator, an output driver, and a drive controller. The gain controller selectively amplifies an analog input signal according to a level control signal, and outputs a corresponding gain-adjusted analog input signal. The pulse-width modulator converts the gain-adjusted analog input signal into a pulse signal. The output driver includes a plurality of output driver circuits which generate an amplified pulse signal corresponding to the pulse signal output by the pulse-width modulator. The drive controller selectively disables a subset of the plurality of output driver circuits according to the level control signal.

BRIEF DESCRIPTION OF THE DRAWINGS

The above and other aspects and features of the present invention will be more readily apparent from the detailed descriptions that follows, with reference to the accompanying drawings, in which.

DETAILED DESCRIPTION OF EMBODIMENTS

The present invention will now be explained by way of preferred, but non-limiting, embodiments of the invention. Various modifications to the disclosed embodiments may be adopted without departing from the spirit and scope of the invention as defined by the appended claims.

Figure 1:
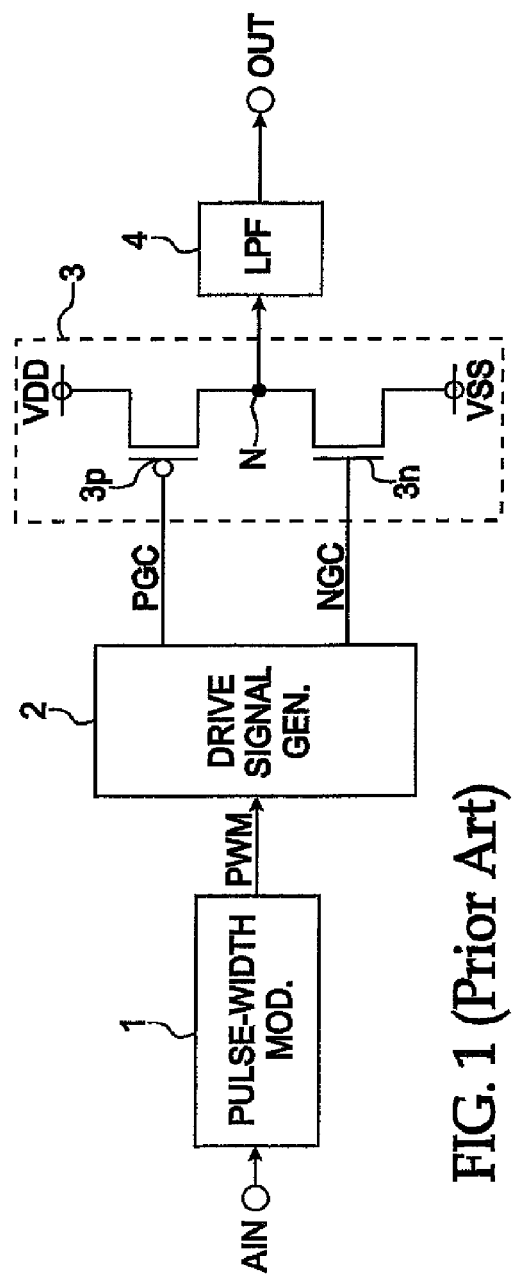
FIG. 1 is a diagram illustrating a conventional class-D amplifier circuit.
Figure 2:
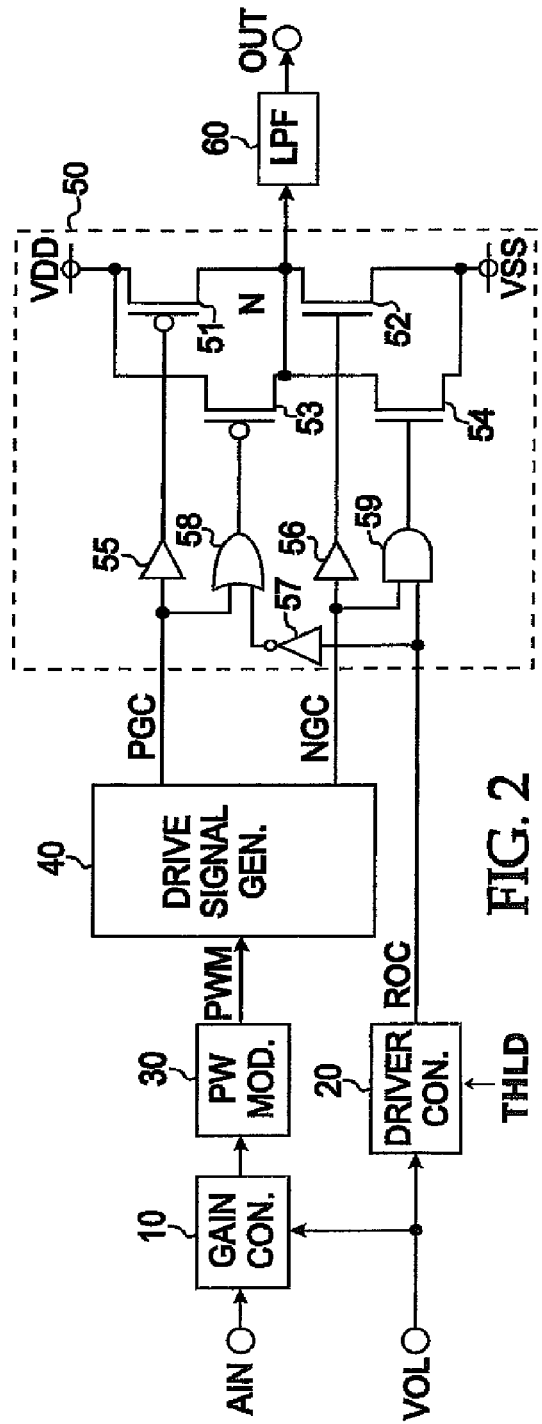
FIG. 2 is a diagram illustrating a class-D amplifier circuit according to an embodiment of the present invention.

FIG. 2 is a diagram illustrating a class-D amplifier circuit according to an embodiment of the present invention.

The class-D amplifier circuit of the example of FIG. 2 includes a gain controller 10, a drive controller 20, a pulse-width modulator 30, a drive control signal generator 40, an output driver 50, and a low-pass filter (LPF) 60.

The gain controller 10 is responsive to a volume control signal VOL to control the signal level of an input analog audio signal AIN, and to output a corresponding gain-adjusted input analog audio signal which is supplied to the pulse-width modulator PWM 30. Depending on the volume control signal VOL, the signal level of the gain-adjusted input analog audio signal will generally be higher than the signal level of the input analog audio signal AIN. However, the embodiment is not limited in this respect. That is, the signal level of the gain-adjusted input analog audio signal is determined by the volume control signal VOL and may be greater than, less than, or the same as the signal level of the original input analog audio signal AIN.

The drive controller 20 determines whether a setup volume indicated by the volume control signal VOL is larger or smaller than a predetermined threshold value THLD, and generates a drive control signal ROC based on a comparison result. In the specific example of FIG. 2, if the setup volume is larger than the threshold value THLD, the drive control signal ROC of logic level "H" is output to the output driver 50, and if the setup volume is smaller than the threshold value THLD, a drive control signal ROC of logic level "L" is output to the output driver 50.

The pulse-width modulator 30 converts the gain-adjusted audio analog input signal into binary pulse train (i.e., a pulse-width modulated PWM signal) having a duty ratio which is proportional to an amplitude of the gain-adjusted audio analog input signal. The PWM signal (e.g., 1-MHz digital signal) can be obtained, for example, by utilizing a comparator to compare the gain-adjusted audio analog input signal to a high-frequency saw-tooth wave signal. However, the embodiment is not limited by the particulars of the pulse-width modulator 30, and other PWM schemes may be adopted.

The drive signal generator 40 converts the PWM signal into two drive signals, namely, a PGC drive signal and an NGC drive signal. In the specific example of FIG. 2, when the pulse-width modulated signal PWM is logic "H", the PGC drive signal is logic "L" and the NGC drive signal is logic "L". When the pulse-width modulated signal PWM is logic "L", the PGC drive signal is logic "H" and the NGC drive signal is logic "H". In this embodiment, the two separate PGC and NGC drive signals are generated for added control during transitions of the pulse-width modulated PWM signal. However, it will be understood that a single drive signal can instead be generated. Further, a configuration which omits the drive signal generator 40 may be adopted. For example, the output driver 50 may be driven directly by the PWM signal.

The output driver 50 includes a plurality of output driver circuits. In the example of FIG. 2, two output driver circuit are provided, namely, a first driver circuit which includes a PMOS transistor 51 and an NMOS transistor 52 connected in series between a positive voltage VDD and a negative voltage VSS, and a second driver circuit which includes a PMOS transistor 53 and an NMOS transistor 54 connected in series between the positive voltage VDD and the negative voltage VSS. Drain terminals of the PMOS transistors 51, 53 and NMOS transistor 52, 54 are commonly connect to an output node N.

The output driver 50 also includes a logic circuit which is responsive to the drive control signal ROC to operationally disable a subset (i.e., at least one, but not all) of the plural output driver circuits. In the example of FIG. 2, the second output driver circuit including the PMOS transistor 53 and the NMOS transistor 54 is operationally disabled by the drive control signal ROC.

More specifically, the PGC drive signal from the drive signal generator 40 is applied to the gate of the first driver PMOS 51 through a buffer 55, and the NGC drive signal from the drive signal generator 40 is applied to the gate of the first driver NMOS 52 through a buffer 56. An inverted drive control signal ROC and the PGC drive signal are input in an OR gate 58, and the logical OR thereof is applied to the gate of the second driver PMOS 53. The drive control signal ROC and the NGC drive signal are input to an AND gate 59, and the logical AND thereof is to the gate of NMOS 54.

It can be seen that when the drive control signal ROC is logic "L", the second driver PMOS 53 and the second driver NMOS 54 remain in an OFF state, regardless of the logic levels of the PGC and NGC drive signals. Conversely, when the drive control signal ROC is logic "H", the ON-OFF states of the second driver PMOS 53 and NMOS 54 are controlled by the PGC and NGC drive signals, respectively.

More specifically, if the setup volume denoted by the volume control signal VOL is smaller than the threshold value, the drive control signal ROC supplied to the output driver 50 is logic "L". Thus, an output signal of the OR gate 58 remains at logic "H" regardless of the logic level of the PGC drive signal. Further, an output signal of the AND gate 59 remains at logic "L" regardless of the logic state of the NGC drive signal. Thus, the PMOS transistor 53 and NMOS transistor 54 are fixed in an OFF state, and the second output driver of the output driver 50 is operationally disabled. In the meantime, the PGC and NGC drive signals are respectively applied via the buffers 55 and 56 to the gates of the PMOS transistor 51 and NMOS transistor 52, and the first driver circuit of the output driver 50 operates normally.

On the other hand, if the setup volume is larger than the threshold value, the drive control signal ROC applied to the output driver 50 is logic "H". Thus, an output signal from the OR gate 58 has the same logic value as that of the PGC drive signal, and an output signal from the AND gate 59 has the same logic value as that of the NGC drive signal. In this case, both the first and the second output drive circuits of the output driver 50 are operational.

As described above, a subset of the plural output driver circuits of the output driver 50 is operationally disabled when the setup volume is less than a threshold value, thereby enhancing the power efficiency of the class-D amplifier circuit.

FIG. 2 also illustrates a low-pass filter LPF 60 which removes high-frequency components from the output of the output driver 50, and which outputs a corresponding voice band analog output signal. The LPF 60 may, for example, be configured by capacitor and inductor connected to node N to obtain low-pass filter characteristics.

Figure 3:
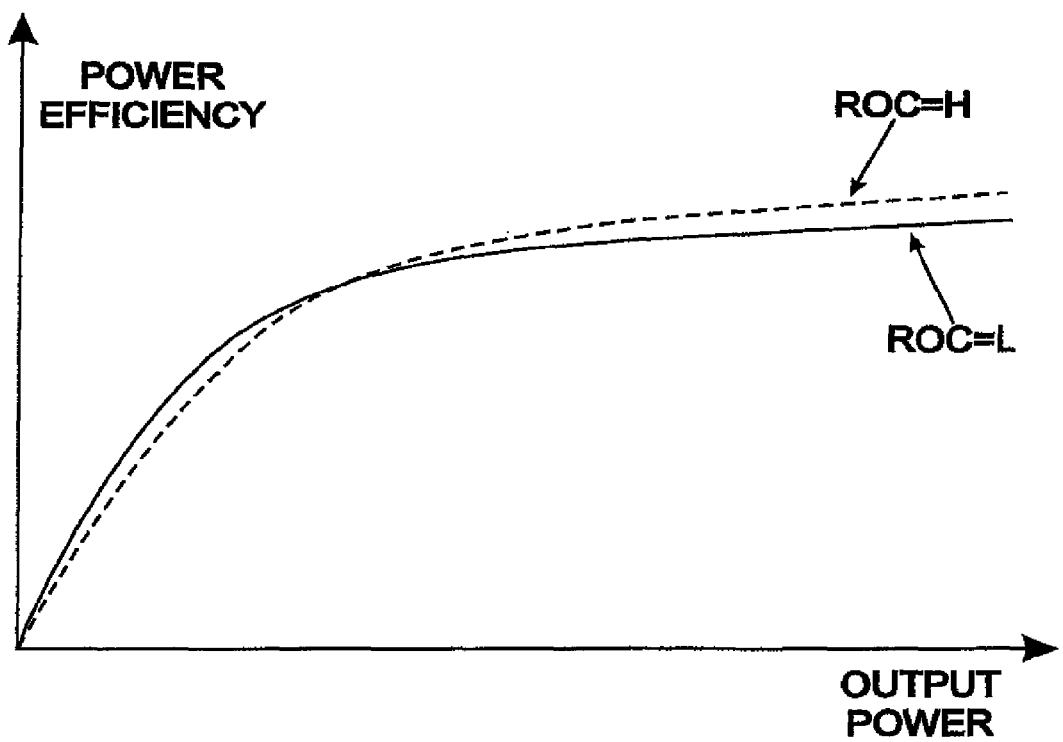
FIG. 3 is a graph showing output power vs. power efficiency characteristics of a class-D amplifier circuit according to an embodiment of the present invention.

FIG. 3 is a graph showing output power vs. power efficiency characteristics (in normalized units) of a class-D amplifier circuit according to the embodiment of FIG. 2. The solid line of FIG. 3 illustrates characteristics when the drive control signal ROC is "L" (i.e., the second driver circuit is operationally disabled), and the dashed line illustrates characteristics when the drive control signal ROC is "H" (i.e., both the first and second drive circuits are operational). It can be seen that power efficiency can be improved by disabling the second input driver circuit when the output power is relatively small, and by operating both input driver circuits when the output power is relative large.

The present invention is not limited to the example presented above in connection with FIG. 2, and non-limiting examples of different variations of the invention are presented below.

For example, the class-D amplifier circuit may be utilized in non-audio applications, such as to drive a motor having a small load impedance.

Figure 4:
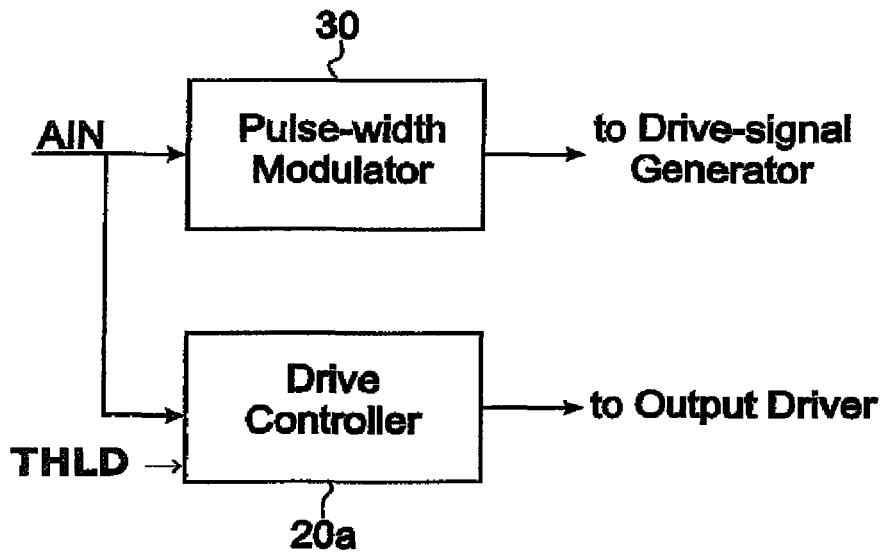
FIG. 4 is a diagram illustrating a portion of a class-D amplifier circuit according to another embodiment of the present invention.
Figure 5:
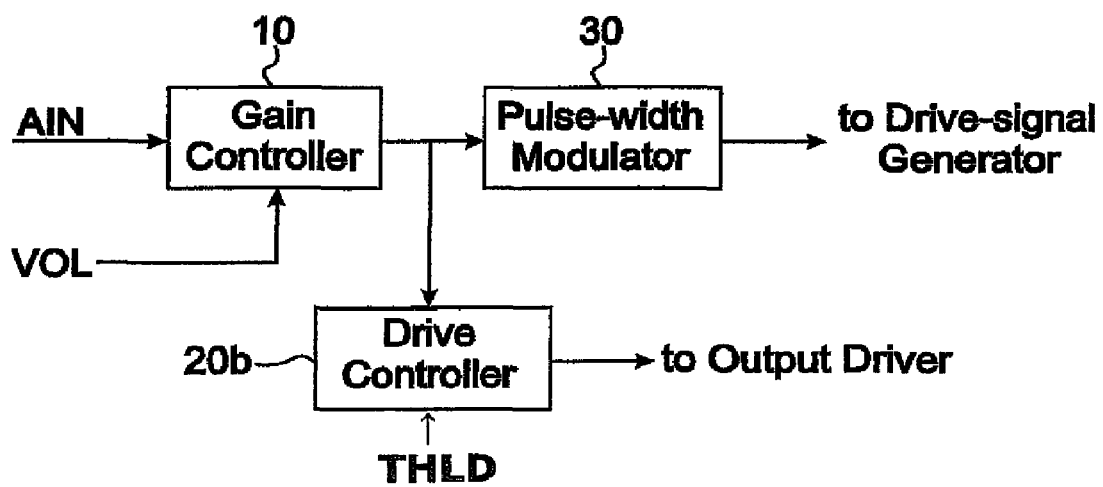
FIG. 5 is a diagram illustrating a portion of a class-D amplifier circuit according to another embodiment of the present invention.

As another example, FIG. 4 illustrates a variation in which drive controller 20a generates the drive control signal ROC based on whether the signal level of the original audio analog input signal is greater than or less than a predetermined threshold level THLD. FIG. 5 illustrates yet another variation in which drive controller 20b generates the drive control signal ROC based on whether the signal level of the gain-adjusted audio analog input signal is greater than or less than a predetermined threshold level THLD.

The output driver 50 in the above examples is equipped with two drivers. However, three or more drivers can be provided. Also, in this case, the drive controller 20 (20a and 20b) can be configured to compare an input signal (or value) with two or more threshold values, thereby selectively disabling different combinations of the three or more drivers.

In the illustrated embodiments, the first driver circuit of the output driver 50 is not capable of being operationally disabled by the drive controller 20. However, it is also possible to adopt a configuration in which either one of the first or second driver circuits is selectively disabled. In other words, at any one time, any of the driver circuits of the output driver can constitute the subset of driver circuits which are disabled.

The gate width W of the transistors of the driver circuits has not been discussed above in the context of the embodiments. However, it is noted that the gate widths of the first driver and the second driver may be set at different values (for example, at a 1:2 ratio). In this case, the drive controller 20 (20a and 20b) can be configured to selectively disable either one of the first or second drivers. That is, three operational modes are made possible—a first in which only the first driver is operated, a second in which only the second driver is operated, and a third in which both drivers are operated.

The output driver 50 can be reconfigured in a number of different ways. That is, the driver circuits and/or the circuitry utilized to operationally disable a subset of the driver circuits may be different from that illustrated in FIG. 2. Further, the plural driver circuits need not have the same electrical configuration as each other.

Thus, it will be understood that the invention is not limited by the embodiments described above, and that modifications and variations thereof may be made without departing from the spirit and scope of the invention as defined by the appended claims.

What is claimed is:

1. A class-D amplifier circuit, comprising:
   a pulse-width modulator which converts an input signal into a pulse signal;
   an output driver comprising a plurality of output driver circuits which generate an amplified pulse signal corresponding to the pulse signal output by the pulse-width modulator;
   a drive controller which selectively disables a subset of the plurality of output driver circuits,
   wherein the input signal is a gain-adjusted audio input signal, and
   wherein the class-D amplifier circuit further comprises a gain controller which receives an audio input signal and outputs the gain-adjusted audio input signal according to a volume control signal.

2. The class-D amplifier circuit of claim 1, wherein the drive controller is responsive to a signal level of the input signal to selectively disable the subset of the plurality of output driver circuits.

3. The class-D amplifier circuit of claim 1, wherein output driver comprises a first output driver circuit and a second output driver circuit,
   wherein the first and second output driver circuits are both operational when the level of the input signal is more than a threshold value, and
   wherein the first output driver circuit is operational and the second output driver circuit is disabled when the level of the input signal is less than the threshold value.

4. The class-D amplifier circuit of claim 3, wherein the drive controller receives the input signal and compares the level of the input signal to the threshold value.

5. A class-D amplifier circuit, comprising:
   a pulse-width modulator which converts an input signal into a pulse signal;
   an output driver comprising a plurality of output driver circuits which generate an amplified pulse signal corresponding to the pulse signal output by the pulse-width modulator;
   a drive controller which selectively disables a subset of the plurality of output driver circuits,
   wherein the drive controller is responsive to a volume control signal to selectively disable the subset of the plurality of output driver circuits.

6. The class-D amplifier circuit of claim 5, wherein the output driver further comprises a logic circuit operatively connected between the pulse-width modulator and the subset of the plurality of output driver circuits, and
   wherein the logic circuit is responsive to the drive controller to selectively disable the subset of the plurality of output drive circuits.

7. The class-D amplifier circuit of claim 5, further comprising a low-pass filter connected to the output of the output driver.

8. The class-D amplifier circuit of claim 5, wherein the input signal is an audio input signal.

9. The class-D amplifier circuit of claim 5, wherein the input signal is a gain-adjusted audio input signal.

10. The class-D amplifier circuit of claim 9, further comprising a gain controller which receives an audio input signal and outputs the gain-adjusted audio input signal according to a volume control signal.

11. The class-D amplifier circuit of claim 5, further comprising a drive signal generator operatively connected between the pulse-width modulator and the output driver.

12. A class-D amplifier circuit, comprising:
- a gain controller which selectively amplifies an analog input signal according to a level control signal, and outputs a corresponding gain-adjusted analog input signal;
- a pulse-width modulator which converts the gain-adjusted analog input signal into a pulse signal;
- an output driver comprising a plurality of output driver circuits which generate an amplified pulse signal corresponding to the pulse signal output by the pulse-width modulator;
- a drive controller which selectively disables a subset of the plurality of output driver circuits according to the level control signal.

13. The class-D amplifier circuit of claim 12, wherein the analog input signal is an audio signal, and the level control signal is a volume control signal.

14. The class-D amplifier circuit of claim 12, wherein the output driver further comprises a logic circuit operatively connected between the pulse-width modulator and the subset of the plurality of output driver circuits, and
- wherein the logic circuit is responsive to the drive controller to selectively disable the subset of the plurality of output drive circuits.

15. The class-D amplifier circuit of claim 12, wherein output driver comprises a first output driver circuit and a second output driver circuit,
- wherein the first and second output driver circuits are both operational when the level control signal is more than a threshold value, and
- wherein the first output driver circuit is operational and the second output driver circuit is disabled when the level control signal is less than the threshold value.

16. The class-D amplifier circuit of claim 15, wherein the drive controller receives the level control signal and compares a value of the level control signal to the threshold value.

17. The class-D amplifier of claim 12, further comprising a low-pass filter connected to the output of the output driver.

18. The class-D amplifier circuit of claim 12, further comprising a drive signal generator operatively connected between the pulse-width modulator and the output driver.

\* \* \* \* \*